(12) United States Patent
Teratani et al.

(10) Patent No.: US 8,236,722 B2
(45) Date of Patent: Aug. 7, 2012

(54) ALUMINUM OXIDE SINTERED PRODUCT AND METHOD FOR PRODUCING THE SAME

(75) Inventors: Naomi Teratani, Nagoya (JP); Yuji Katsuda, Tsushima (JP); Yoshimasa Kobayashi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 265 days.

(21) Appl. No.: 12/549,524

(22) Filed: Aug. 28, 2009

(65) Prior Publication Data

US 2010/0056358 A1 Mar. 4, 2010

(30) Foreign Application Priority Data

Sep. 1, 2008 (JP) ................................. 2008-223910
Jul. 27, 2009 (JP) ................................. 2009-174334

(51) Int. Cl.
*C04B 35/00* (2006.01)
*B32B 9/00* (2006.01)
*B32B 19/00* (2006.01)

(52) U.S. Cl. ........ 501/153; 501/127; 428/696; 428/699; 428/702

(58) Field of Classification Search .................. 501/126, 501/127, 153; 428/689, 691, 696, 699, 702
See application file for complete search history.

(56) References Cited

U.S. PATENT DOCUMENTS

| 4,383,957 | A | * | 5/1983 | Yamakawa et al. | ........... 264/663 |
|---|---|---|---|---|---|
| 5,043,305 | A | * | 8/1991 | Tanaka et al. | ................. 501/103 |
| 5,294,576 | A | * | 3/1994 | Mizushima et al. | .......... 501/128 |
| 6,950,297 | B2 | | 9/2005 | Kosakai | |

FOREIGN PATENT DOCUMENTS

| JP | 2003-152065 A1 | 5/2003 |
|---|---|---|
| JP | 2004-022585 A1 | 1/2004 |

* cited by examiner

*Primary Examiner* — Jerry Lorengo
*Assistant Examiner* — Noah Wiese
(74) *Attorney, Agent, or Firm* — Burr & Brown

(57) ABSTRACT

An aluminum oxide sintered product including a layer phase containing a rare-earth element and fluorine among grains of aluminum oxide serving as a main component, or a phase containing a rare-earth element and fluorine along edges of grains of aluminum oxide serving as a main component. The product includes a phase containing a rare-earth element and a fluorine element among grains of aluminum oxide, the phase not being in the form of localized dots but in the form of line segments, when viewed in an SEM image. The product can be readily adjusted to have a volume resistivity in the range of $1\times10^{13}$ to $1\times10^{16}$ Ω·cm, the volume resistivity being calculated from a current value after the lapse of 1 minute from the application of a voltage of 2 kV/mm to the aluminum oxide sintered product at room temperature.

20 Claims, 9 Drawing Sheets
(4 of 9 Drawing Sheet(s) Filed in Color)

Example 2 (mixed with YbF$_3$, fired at 1600°C)

Comparative Example 5 (mixed with Yb$_2$O$_3$, fired at 1600°C)

Example 3 (mixed with YbF₃, fired at 1700°C)

Comparative Example 6 (mixed with Yb₂O₃, fired at 1700°C)

Example 17

Amount of MgO: 0.4 parts by weight
Volume resistivity: $4.3 \times 10^{13}$ Ω·cm
Strength: 260MPa Example 18

Mount of MgO: 0.2 parts by weight
Volume resistivity: $2.3 \times 10^{14}$ Ω·cm
Strength: 180MPa Example 4

Amount of MgO: 0 part by weight
Volume resistivity: $4.5 \times 10^{14}$ Ω·cm
Strength: 240MPa

ALUMINUM OXIDE SINTERED PRODUCT AND METHOD FOR PRODUCING THE SAME

BACKGROUND ART

1. Field of the Invention

The present invention relates to an aluminum oxide sintered product and a method for producing such an aluminum oxide sintered product.

2. Description of the Related Art

Electrostatic chucks have been used for holding wafers in semiconductor manufacturing equipment. Such an electrostatic chuck includes an internal electrode for applying a voltage and a dielectric layer placed on the internal electrode. When a wafer is placed on the dielectric layer and a voltage is applied to the internal electrode, an electrostatic attractive force is produced between the wafer and the dielectric layer. There are electrostatic chucks employing a monopolar system in which one internal electrode is contained and electrostatic chucks employing a bipolar system in which a pair of (that is, two) internal electrodes are contained so as to be spaced apart from each other. An electrostatic chuck employing the monopolar system is configured to produce an electrostatic attractive force by applying a voltage between the internal electrode of the electrostatic chuck and an external electrode placed outside the electrostatic chuck. An electrostatic chuck employing the bipolar system is configured to produce an electrostatic attractive force by applying a voltage to a pair of internal electrodes. Referring to FIG. 11, such electrostatic chucks are broadly divided into a Johnson-Rahbeck type in which a wafer is attracted with a Johnson-Rahbeck force produced using a dielectric layer having a volume resistivity of about $10^8$ to $10^{12}$ Ω·cm, and a Coulomb type in which a wafer is attracted with a Coulomb force produced using an insulator (having a volume resistivity of more than $10^{16}$ Ω·cm) as a dielectric layer. The Johnson-Rahbeck type electrostatic chuck provides a high attractive force; however, it requires an expensive power supply having a high current-carrying capacity and small current passes through the wafer due to leakage current, which can electrically damage integrated circuits fabricated in the wafer. For these reasons, the Coulomb type electrostatic chuck, which causes less leakage current, has been often employed in recent years. However, the Coulomb type electrostatic chuck provides an electrostatic attractive force smaller than that in the Johnson-Rahbeck type electrostatic chuck, which is a problem. To solve this problem, studies have been performed on how to control the volume resistivity of a dielectric to be about $1 \times 10^{14}$ Ω·cm to thereby achieve an increase in attractive force and a decrease in leakage current. For example, in Patent Document 1, the volume resistivity is adjusted by firing a mixture containing aluminum oxide and conductive silicon carbide. In Patent Document 2, the volume resistivity is adjusted by firing a mixture containing aluminum oxide and conductive magnesium oxide and titanium oxide.

PRIOR ART DOCUMENTS

Patent Document 1: JP 2003-152065 A
Patent Document 2: JP 2004-22585 A

SUMMARY OF THE INVENTION

However, because silicon compounds and titanium compounds used in Patent Documents 1 and 2 do not have sufficiently high corrosion resistance against, in particular, fluorine-based corrosive gases and the plasmas of such gases, wafers can be contaminated with conductive particles of such compounds.

The present invention has been accomplished in view of such a problem and a major object of the present invention is to provide an aluminum oxide sintered product that can be adjusted to have a volume resistivity between that of the Coulomb type electrostatic chuck and that of the Johnson-Rahbeck type electrostatic chuck and has excellent corrosion resistance.

To achieve the above-described object, the inventors of the present invention fired mixtures of aluminum oxide serving as a main component and various metal oxides, nitrides, carbides, fluorides, and the like with a hot press. As a result, they have found that addition of a fluoride of a rare-earth element to aluminum oxide provides an aluminum oxide sintered product having a volume resistivity between that of the Coulomb type electrostatic chuck and that of the Johnson-Rahbeck type electrostatic chuck. Thus, the present invention has been accomplished.

Specifically, an aluminum oxide sintered product according to the present invention includes a layer phase containing a rare-earth element and fluorine among grains of aluminum oxide serving as a main component. The term "layer" includes the case where a layer is continuously formed and the case where a layer is discontinuously formed. Viewed from another aspect, an aluminum oxide sintered product according to the present invention includes a phase containing a rare-earth element and fluorine along edges of grains of aluminum oxide serving as a main component. The term "along edges" includes the case where the phase is continuously present along the edges and the case where the phase is discontinuously present along the edges.

An aluminum oxide sintered product according to the present invention can be readily adjusted to have a volume resistivity between that of the Coulomb type electrostatic chuck and that of the Johnson-Rahbeck type electrostatic chuck, the volume resistivity being calculated from a current value after a lapse of 1 minute from an application of a voltage of 2 kV/mm to the aluminum oxide sintered product at room temperature. As a result, such an aluminum oxide sintered product provides an attractive force stronger than that of the Coulomb type electrostatic chuck and causes leakage current smaller than that in the Johnson-Rahbeck type electrostatic chuck. Aluminum oxide has a sufficiently high corrosion resistance, and a phase containing a rare-earth element and fluorine has a corrosion resistance higher than those of silicon compounds and titanium compounds and also higher than or equal to that of alumina. Thus, such an aluminum oxide sintered product on the whole has a high corrosion resistance against, in particular, fluorine-based corrosive gases and the plasmas of such gases. The reason why the volume resistivity can be readily adjusted between that of the Coulomb type electrostatic chuck and that of the Johnson-Rahbeck type electrostatic chuck is not known; however, one possible reason is that a phase containing a rare-earth element and fluorine has an electrical resistance lower than that of aluminum oxide, the phase being present in the shape of a layer among grains of aluminum oxide or along edges of grains of aluminum oxide.

BRIEF DESCRIPTION OF THE DRAWINGS

The patent or application filed contains at least one drawing executed in color. Copies of this patent or patent application publication with color drawing(s) will be provided by the Office upon request and payment of the necessary fee.

DETAILED DESCRIPTION OF THE INVENTION

Figure 1A:
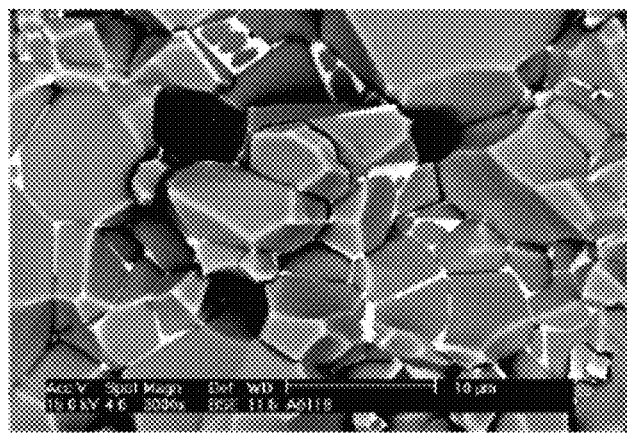
FIG. 1A corresponds to Example 2 (additive: YbF$_3$, firing temperature: 1600° C.) and FIG. 1B corresponds to Comparative Example 5 (additive: Yb$_2$O$_3$, firing temperature: 1600° C.).

An aluminum oxide sintered product according to the present invention includes a layer phase containing a rare-earth element and fluorine among grains of aluminum oxide serving as a main component, or a phase containing a rare-earth element and fluorine along edges of grains of aluminum oxide serving as a main component.

An aluminum oxide sintered product according to the present invention includes a phase containing a rare-earth element and a fluorine element among grains of aluminum oxide, the phase not being in the form of localized dots but in the form of line segments, when viewed in an SEM image. Such an SEM image verifies that, when viewed in three dimensions, an aluminum oxide sintered product according to the present invention includes a layer phase containing a rare-earth element and fluorine among grains of aluminum oxide, or a phase containing a rare-earth element and fluorine along edges of grains of aluminum oxide.

An aluminum oxide sintered product according to the present invention preferably has a volume resistivity of $1\times10^{13}$ to $1\times10^{16}$ Ω·cm, the volume resistivity being calculated from a current value after the lapse of 1 minute from the application of a voltage of 2 kV/mm to the aluminum oxide sintered product at room temperature. In this case, the volume resistivity is between that of the Coulomb type electrostatic chuck and that of the Johnson-Rahbeck type electrostatic chuck. Thus, an electrostatic chuck including an aluminum oxide sintered product according to the present invention as a dielectric provides a higher attractive force than that of the Coulomb type electrostatic chuck and has leakage current less than that in the Johnson-Rahbeck type electrostatic chuck.

Aluminum oxide grains in an aluminum oxide sintered product according to the present invention may have the shape of a sphere (a spherical shape, an elliptical spherical shape, or the like) or a polyhedron, and preferably have the shape of a polyhedron. The average diameter of the grains is not particularly restricted. However, too large an average grain diameter can result in a decrease in the strength and hence an average grain diameter of 40 μm or less is preferred. Too small an average grain diameter does not particularly cause a problem, however, the average grain diameter is generally substantially 0.3 μm or more. Such an alumina grain diameter was determined by observing a fracture section of a sample with an electron microscope after a bending test, calculating an average grain diameter by line-segment method, and multiplying the average grain diameter by 1.5.

A rare-earth element in an aluminum oxide sintered product according to the present invention is not particularly restricted. However, such a rare-earth element is preferably, for example, yttrium, lanthanum, or ytterbium. As well known, rare-earth elements refer to 17 elements consisting of lanthanoide series, scandium, and yttrium. The lanthanoide series refer to 15 elements consisting of lanthanum, cerium, praseodymium, neodymium, promethium, samarium, europium, gadolinium, terbium, dysprosium, holmium, erbium, thulium, ytterbium, and lutetium. The content of such a rare-earth element is not particularly restricted. However, too large a content of a rare-earth element tends to cause a deviation in the value of the thermal conductivity, the thermal expansion coefficient, or the like of aluminum oxide. In view of this, the content of a rare-earth element is preferably 20 wt % or less, more preferably, 5 wt % or less. Too small a content of a rare-earth element results in a decrease in the amount of a grain boundary phase presumably contributing to conductivity, which may result in an undesired resistance characteristic. In view of this, the content of a rare-earth element is preferably 0.1 wt % or more, more preferably, 0.3 wt % or more. The content of the fluorine element is also not particularly restricted. However, too large a content of the fluorine element tends to decrease the probability of achieving a closely packed structure. Too small a content of the fluorine element tends to decrease the probability of achieving a desired microstructure and a desired resistance characteristic. In view of this, the content of the fluorine element is preferably in the range of 0.05 to 5 wt %, more preferably, in the range of 0.1 to 2 wt %.

In an aluminum oxide sintered product according to the present invention, the phase containing a rare-earth element and fluorine preferably further contains magnesium, and the content of the magnesium is preferably 0.1 wt % or more relative to the sintered product in entirety. When the content of the magnesium is less than 0.1 wt % relative to the sintered product in entirety, the sintered product has a reduced strength compared with that of a sintered product containing no magnesium. In contrast, when the content of the magnesium is 0.1 wt % or more, the strength of the sintered product is enhanced. Note that the content of the magnesium is not particularly restricted. However, too large a content of the magnesium results in a volume resistivity of more than $1\times10^{16}$ Ω·cm at room temperature and hence the content of the magnesium is preferably 5 wt % or less.

In an aluminum oxide sintered product according to the present invention, the phase containing a rare-earth element and fluorine preferably further contains magnesium, and the weight ratio of the magnesium to the rare-earth element is preferably 0.1 to 0.33. When the weight ratio satisfies this range, a sintered product having a high strength can be obtained compared with that of a sintered product containing no magnesium.

In an aluminum oxide sintered product according to the present invention, the grains of aluminum oxide preferably have a diameter of 7 μm or less. When the grains of aluminum oxide have a diameter of 7 μm or less, a sintered product having a high strength can be obtained. In particular, when the diameter is 6 μm or less, a sintered product having a higher strength can be obtained.

An aluminum oxide sintered product according to the present invention can be used as a dielectric for an electrostatic chuck. Specifically, an electrostatic chuck may be produced by embedding an internal electrode into an aluminum oxide sintered product according to the present invention; an electrostatic chuck may be produced by covering the top surface of an internal electrode with an aluminum oxide sintered product according to the present invention, and covering the bottom surface and the side surface of the internal electrode with another sintered product; or an electrostatic chuck may be produced by covering the top surface and the side surface of an internal electrode with an aluminum oxide sintered product according to the present invention, and covering the bottom surface of the internal electrode with another sintered product. Note that such an electrostatic chuck may employ a monopolar system or a bipolar system.

An aluminum oxide sintered product according to the present invention may further contain another additive such as a metal oxide or a metal nitride as long as the elements or the amount of the additive does not cause contamination in semiconductors. An example of such a metal oxide is magnesium oxide. An example of such a metal nitride is aluminum nitride. Such an additive plays a role of controlling the shape or the diameter of aluminum oxide grains in a sintered product. Note that, in view of corrosion resistance, the content of such a component is desirably low.

A method for producing an aluminum oxide sintered product according to the present invention includes hot-press firing a mixture containing aluminum oxide serving as a main raw material and a fluorine compound of a rare-earth element in a vacuum or an inert atmosphere to provide an aluminum oxide sintered product. Use of this production method readily provides an aluminum oxide sintered product having a volume resistivity between that of the Coulomb type electrostatic chuck and that of the Johnson-Rahbeck type electrostatic chuck, the volume resistivity being calculated from a current value after the lapse of 1 minute from the application of a voltage of 2 kV/mm to the aluminum oxide sintered product at room temperature.

An aluminum oxide used for a method for producing an aluminum oxide sintered product according to the present invention preferably has a high purity, for example, a purity of 99% or more, in particular, a purity of 99.5% or more. Aluminum oxide grains may have the shape of a sphere (a spherical shape, an elliptical spherical shape, or the like) or a polyhedron, and preferably have the shape of a polyhedron.

A fluorine compound of a rare-earth element used for a method for producing an aluminum oxide sintered product according to the present invention is preferably one or more selected from the group consisting of scandium fluoride, yttrium fluoride, lanthanum fluoride, cerium fluoride, praseodymium fluoride, neodymium fluoride, samarium fluoride, europium fluoride, gadolinium fluoride, terbium fluoride, dysprosium fluoride, holmium fluoride, erbium fluoride, thulium fluoride, ytterbium fluoride, and lutetium fluoride; more preferably, yttrium fluoride, lanthanum fluoride, or ytterbium fluoride.

In a method for producing an aluminum oxide sintered product according to the present invention, too small a weight ratio of a fluorine compound of a rare-earth element to aluminum oxide results in a high volume resistivity and there is a possibility that a sufficiently high attractive force is not obtained; when the weight ratio is large, the volume resistivity is not lower than about $10^{13}$ Ω·cm, however, another material characteristic such as strength may be adversely affected. In view of this, the amount of a fluorine compound of a rare-earth element to be added relative to 100 parts by weight of aluminum oxide is preferably in the range of 0.5 to 10 parts by weight, more preferably, in the range of 1 to 5 parts by weight. When a mixture containing magnesium oxide is used as a mixture to be hot-press fired, the magnesium oxide is preferably added such that 0.3 or more parts by weight of magnesium oxide is added relative to 100 parts by weight of aluminum oxide and/or the weight ratio of the magnesium oxide to a fluorine compound of a rare-earth element is 0.1 to 0.4. In this case, a sintered product having a high strength can be obtained compared with the case where no magnesium oxide is added.

According to a method for producing an aluminum oxide sintered product according to the present invention, a mixture containing aluminum oxide serving as a main raw material and a fluorine compound of a rare-earth element is wet blended in an organic solvent to provide a slurry, and the slurry is dried to provide prepared powder. Note that the wet blending may be conducted with a blending mill such as a pot mill, a trommel, or an attrition mill. Alternatively, dry blending may be conducted instead of the wet blending. In a step of compacting the prepared powder, die pressing may be employed in the case where a plate-shaped compact is produced. Compacting pressure is preferably 100 kgf/cm$^2$ or more, however, it is not particularly restricted as long as the resultant shape can be retained. The prepared powder in a state of powder may also be charged into a hot-press dice. It is said that fluorine compounds generally inhibit sintering of aluminum oxide and firing at normal pressure often does not provide a dense sintered product. Accordingly, firing with a hot press is suitable as in a material according to the present invention. As for pressure in such hot-press firing, too low a pressure tends not to provide a dense product while too high a pressure can cause a grain boundary phase component entering a liquid phase, if present, to be washed away from a sintered product or too high a pressure tends to result in remaining of closed pores, which can inhibit providing of a dense product. In view of this, the pressure at the maximum temperature of the firing is preferably at least 30 to 300 kgf/cm$^2$, more preferably, 50 to 200 kgf/cm$^2$. Too low a firing temperature can result in a product that is not fully densified while too high a firing temperature can result in too large aluminum oxide grains or evaporation of a fluorine compound. In view of this, the firing temperature is preferably set in the range of 1400° C. to 1850° C., more preferably, in the range of 1500° C. to 1750° C. The hot-press firing, which is conducted in a vacuum or an inert atmosphere, may be conducted in a vacuum atmosphere from normal temperature to a predetermined temperature (for example, 1500° C., 1550° C., or 1600° C.), and in an inert atmosphere from the predetermined temperature to firing temperature and during maintaining the firing temperature. Note that the predetermined temperature and the firing temperature may be the same temperature. Herein, the inert atmosphere is a gas atmosphere that does not influence the firing and examples of such an inert atmosphere include nitrogen atmosphere, helium atmosphere, and argon atmosphere.

According to a method for producing an aluminum oxide sintered product according to the present invention, an aluminum oxide sintered product is likely to be provided that has an open porosity of 0% to 0.50% and a bulk density of 3.90 to 4.10 g/cm$^3$; and an aluminum oxide sintered product is likely to be provided that has a content of a rare-earth element of 0.5 to 2.5 wt % by inductively coupled plasma emission spectroscopy and has a content of fluorine of 0.1 to 0.6 wt % by thermal hydrolysis ion chromatography.

EXAMPLES

Example 1

A commercially available aluminum oxide (Al$_2$O$_3$) powder having a purity of 99.99% or more and an average particle diameter of 0.6 μm, and a commercially available ytterbium fluoride (YbF$_3$) powder having a purity of 99.9% or more and an average particle diameter of 10 μm or less, were mixed with the ratio of Al$_2$O$_3$ powder to the YbF$_3$ powder being 100 parts by weight to 1.25 parts by weight. These weighed powders were wet ball-milled in a nylon pot with isopropyl alcohol serving as a solvent and alumina balls having a diameter of 5 mm for 4 hours. The average particle diameters of the raw material powders were determined by laser diffraction. After the mixing, the resultant slurry was taken out into a vat, dried under nitrogen flow at 110° C. for 16 hours, and subsequently sieved through a 30-mesh sieve to provide prepared powder. The prepared powder was compacted by uniaxial pressing at a pressure of 200 kgf/cm$^2$ to prepare a disc-shaped compact having a diameter of about 50 mm and a thickness of about 20 mm. This compact was put into a graphite mold for firing. Firing was conducted by hot pressing. The pressure upon the firing was 100 kgf/cm. As for atmosphere upon the firing, vacuum atmosphere was used from room temperature to 1600° C. and nitrogen gas at 1.5 kgf/cm$^2$ was subsequently introduced until the firing was complete at 1600° C. The firing was complete after the firing temperature was maintained for 2 hours. In this way, an aluminum oxide sintered product of Example 1 was obtained.

The resultant sintered product was processed and measured in terms of the following items (1) to (8). The measurement results are shown in Table 1. In Table 1, "E" represents a power of 10. For example, "1E+14" represents "1×10$^{14}$". Several commercially available aluminum oxide powders having a high purity of 99.0% to 99.995% other than the powder used in Example 1 were also used as aluminum oxide and results similar to those in Example 1 were obtained.

(1) Open Porosity and Bulk Density

Open porosity and bulk density were measured by Archimedes method with pure water serving as a medium.

(2) Volume Resistivity

Volume resistivity was measured by a method in accordance with JIS C2141 in the air at room temperature. A sample piece was prepared to have a diameter of 50 mm and a thickness of 0.5 to 1 mm. Electrodes were formed of silver such that a main electrode had a diameter of 20 mm, a guard electrode had an inner diameter of 30 mm and an outer diameter of 40 mm, and an application electrode had a diameter of 40 mm. A voltage of 2 kV/mm was applied. The value of current after the lapse of 1 minute from the application of the voltage was read and the volume resistivity at room temperature was calculated from the value of current.

(3) Crystal Phase

Crystal phase was identified with a rotating anode X-ray diffractometer (RINT manufactured by Rigaku Corporation). Measurement conditions were CuK α, 50 kV, 300 mA, and 2θ=10°-70°.

(4) Content of Rare-Earth

The content was determined by inductively coupled plasma (ICP) emission spectroscopy.

(5) Content of Fluorine

The content was determined by thermal hydrolysis ion chromatography (JIS R9301-3-11).

(6) Content of Magnesium

The content was determined by inductively coupled plasma (ICP) emission spectroscopy.

(7) Strength

The strength was determined by four-point bending test method in accordance with JIS R1601.

(8) Diameter of Alumina Grains

The diameter of alumina grains was determined by observing a fracture section of a sample with an electron microscope after a bending test, calculating an average grain diameter by line-segment method, and multiplying the average grain diameter by 1.5.

TABLE 1

| | Composition (parts by weight) | | | | | | Firing condition[X1] | | Sintered product[X2] | | Mg |
|---|---|---|---|---|---|---|---|---|---|---|---|
| | | | | | | | Firing Temperature | Other | Chemical analysis value (wt %) | | |
| | Al$_2$O$_3$ | YbF$_3$ | YF$_3$ | LaF$_3$ | MgO | AlN | (° C.) | condition | Rareearth | Fluorine | (wt %) |
| Example 1 | 100 | 1.25 | — | — | — | — | 1600 | C1 | 0.67 | 0.15 | 0.00 |
| Example 2 | 100 | 2.08 | — | — | — | — | 1600 | C1 | 1.05 | 0.29 | 0.00 |
| Example 3 | 100 | 2.08 | — | — | — | — | 1700 | C1 | 1.03 | 0.25 | 0.00 |
| Example 4 | 100 | 2.8 | — | — | — | — | 1600 | C1 | 1.40 | 0.40 | 0.00 |
| Example 5 | 100 | 2.8 | — | — | — | — | 1700 | C1 | 1.34 | 0.34 | 0.00 |
| Example 6 | 100 | 3.4 | — | — | — | — | 1600 | C1 | 1.85 | 0.45 | 0.00 |
| Example 7 | 100 | 4.18 | — | — | — | — | 1600 | C1 | 2.05 | 0.51 | 0.00 |
| Example 8 | 100 | 2.08 | — | — | 0.4 | — | 1600 | C1 | 1.19 | 0.31 | 0.17 |
| Example 9 | 100 | 2.08 | — | — | — | 0.4 | 1600 | C1 | 1.08 | 0.27 | 0.00 |
| Example 10 | 100 | 2.08 | 1.88 | — | — | — | 1600 | C1 | 1.86 | 0.45 | 0.00 |
| Example 11 | 100 | — | 1.25 | — | — | — | 1600 | C1 | 0.56 | 0.23 | 0.00 |
| Example 12 | 100 | — | 1.25 | — | — | — | 1700 | C1 | 0.53 | 0.19 | 0.00 |
| Example 13 | 100 | — | — | 1.74 | — | — | 1700 | C1 | 0.83 | 0.26 | 0.00 |
| Example 14 | 100 | 1.25 | — | — | 0.3 | — | 1600 | C1 | 0.68 | 0.18 | 0.12 |
| Example 15 | 100 | 2.08 | — | — | 0.6 | — | 1600 | C1 | 1.23 | 0.32 | 0.27 |
| Example 16 | 100 | 2.8 | — | — | 0.2 | — | 1600 | C1 | 0.69 | 0.22 | 0.06 |
| Example 17 | 100 | 2.8 | — | — | 0.4 | — | 1600 | C1 | 1.51 | 0.38 | 0.16 |

TABLE 1-continued

| | | | | | | | | | | | |
|---|---|---|---|---|---|---|---|---|---|---|---|
| Example 18 | 100 | 2.8 | — | — | 0.6 | — | 1600 | C1 | 1.38 | 0.33 | 0.21 |
| Example 19 | 100 | 2.8 | — | — | 1.0 | — | 1600 | C1 | 1.34 | 0.32 | 0.43 |
| Example 20 | 100 | 3.4 | — | — | 0.6 | — | 1600 | C1 | 1.73 | 0.42 | 0.23 |
| Example 21 | 100 | 4.18 | — | — | 0.16 | — | 1600 | C1 | 1.08 | 0.34 | 0.05 |

| | Sintered product[X2] | | | | |
|---|---|---|---|---|---|
| | Open porosity (%) | Bulk density (g/cm$^3$) | Strength (MPa) | Volume resistivity ($\Omega \cdot$ cm) | Diameter of alumina grains ($\mu$m) | Crystal phase (other than Al$_2$O$_3$) |
| Example 1 | 0.21 | 3.97 | 240 | 1.3E+15 | 6.3 | Yb$_3$Al$_5$O$_{12}$,YbF$_{3-x}$,YbF$_3$ |
| Example 2 | 0.21 | 3.97 | 240 | 6.5E+14 | 7.0 | Yb$_3$Al$_5$O$_{12}$,YbF$_{3-x}$,YbF$_3$ |
| Example 3 | 0.33 | 3.99 | 190 | 4.3E+14 | 12.0 | Yb$_3$Al$_5$O$_{12}$,YbF$_{3-x}$,YbF$_3$ |
| Example 4 | 0.04 | 4.02 | 190 | 4.5E+14 | 8.1 | Yb$_3$Al$_5$O$_{12}$,YbF$_{3-x}$,YbF$_3$ |
| Example 5 | 0.05 | 4.01 | N | 6.1E+14 | 11.8 | Yb$_3$Al$_5$O$_{12}$,YbF$_{3-x}$,YbF$_3$ |
| Example 6 | 0.09 | 4.01 | 220 | 3.1E+14 | 8.6 | Yb$_3$Al$_5$O$_{12}$,YbF$_{3-x}$,YbF$_3$ |
| Example 7 | 0.00 | 4.01 | 210 | 3.4E+14 | 8.7 | Yb$_3$Al$_5$O$_{12}$,YbF$_{3-x}$,YbF$_3$ |
| Example 8 | 0.05 | 3.99 | 290 | 2.2E+14 | 5.3 | Yb$_3$Al$_5$O$_{12}$,YbF$_{3-x}$,YbF$_3$,MgF$_2$ |
| Example 9 | 0.05 | 3.97 | N | 1.7E+13 | N | Yb$_3$Al$_5$O$_{12}$,YbF$_{3-x}$,YbF$_3$ |
| Example 10 | 0.00 | 3.98 | N | 3.4E+14 | N | Yb$_3$Al$_5$O$_{12}$,YbF$_3$,YF$_3$,YOF |
| Example 11 | 0.25 | 3.98 | N | 8.5E+15 | N | Y$_3$Al$_5$O$_{12}$,YF$_3$ |
| Example 12 | 0.23 | 3.98 | N | 4.3E+15 | N | Y$_3$Al$_5$O$_{12}$,YF$_3$ |
| Example 13 | 0.29 | 3.98 | N | 8.5E+15 | N | LaOF,LaF$_3$ |
| Example 14 | 0.04 | 4.00 | 290 | 7.1E+14 | 5.1 | Yb$_3$Al$_5$O$_{12}$,YbF$_{3-x}$,YbF$_3$,MgF$_2$ |
| Example 15 | 0.04 | 4.00 | 300 | 6.9E+14 | 5.0 | Yb$_3$Al$_5$O$_{12}$,YbF$_{3-x}$,YbF$_3$,MgF$_2$,MgAl$_2$O$_4$ |
| Example 16 | 0.06 | 4.00 | 180 | 2.3E+14 | 13.2 | Yb$_3$Al$_5$O$_{12}$,YbF$_{3-x}$,YbF$_3$ |
| Example 17 | 0.08 | 4.01 | 260 | 4.3E+13 | 6.1 | Yb$_3$Al$_5$O$_{12}$,YbF$_{3-x}$,YbF$_3$,MgF$_2$ |
| Example 18 | 0.04 | 4.01 | 260 | 5.7E+14 | 5.7 | Yb$_3$Al$_5$O$_{12}$,YbF$_{3-x}$,YbF$_3$,MgF$_2$,MgAl$_2$O$_4$ |
| Example 19 | 0.06 | 4.00 | 250 | 1.6E+15 | 6.1 | Yb$_3$Al$_5$O$_{12}$,YbF$_{3-x}$,YbF$_3$,MgF$_2$,MgAl$_2$O$_4$ |
| Example 20 | 0.06 | 4.02 | 250 | 4.8E+14 | 6.5 | Yb$_3$Al$_5$O$_{12}$,YbF$_{3-x}$,YbF$_3$,MgF$_2$,MgAl$_2$O$_4$ |
| Example 21 | 0.16 | 4.00 | 200 | 2.8E+14 | 11.4 | Yb$_3$Al$_5$O$_{12}$,YbF$_{3-x}$,YbF$_3$ |

[X1] C1 = Firing temperature maintained for 2 hours, pressure of 100 kgf/cm$^2$, in vacuum atmosphere at from room temperature to 1600° C. and subsequently in N$_2$ atmosphere at from 1600° C. to completion of firing
[X2] N = Not measured

TABLE 2

| | Composition (parts by weight) | | | | | | | Firing condition[X1] | | Sintered product[X2] | |
|---|---|---|---|---|---|---|---|---|---|---|---|
| | | | | | | | | Firing Temperature (° C.) | Other condition | Chemical analysis value (wt %) | |
| | Al$_2$O$_3$ | YbF$_3$ | AlF$_3$ | CaF$_2$ | MgF$_2$ | Yb$_2$O$_3$ | Y$_2$O$_3$ | | | Rareearth | Fluorine |
| Comparative Example 1 | 100 | — | — | — | — | — | — | 1700 | C1 | — | — |
| Comparative Example 2 | 100 | — | 0.82 | — | — | — | — | 1600 | C1 | — | 0.02 |
| Comparative Example 3 | 100 | — | — | 0.77 | — | — | — | 1600 | C1 | — | 0.12 |
| Comparative Example 4 | 100 | — | — | — | 0.61 | — | — | 1600 | C1 | — | 0.07 |
| Comparative Example 5 | 100 | — | — | — | — | 1.94 | — | 1600 | C1 | 1.48 | 0.03 |
| Comparative Example 6 | 100 | — | — | — | — | 1.94 | — | 1700 | C1 | 1.47 | 0.02 |
| Comparative Example 7 | 100 | — | — | — | — | — | 1.11 | 1600 | C1 | 0.62 | 0.02 |
| Comparative Example 8 | 100 | 2.8 | — | — | — | — | — | 1600 | C2 | 1.52 | 0.02 |
| Comparative Example 10 | 100 | 3.4 | — | — | — | — | — | 1600 | C3 | 2.01 | 0.03 |

| | Sintered product[X2] | | | | | | |
|---|---|---|---|---|---|---|---|
| | Mg (wt %) | Open porosity (%) | Bulk density (g/cm$^3$) | Strength (MPa) | Volume resistivity ($\Omega \cdot$ cm) | Diameter of alumina grains ($\mu$m) | Crystal phase (other than Al$_2$O$_3$) |
| Comparative Example 1 | N | 0.06 | 3.98 | N | 7.8E+16 | N | N |
| Comparative Example 2 | N | 0.28 | 3.97 | N | 6.1E+16 | N | N |
| Comparative Example 3 | N | 0.33 | 3.97 | N | 1.4E+17 | N | CaF$_2$ |
| Comparative Example 4 | N | 0.50 | 3.96 | N | 9.9E+16 | N | N |
| Comparative Example 5 | N | 0.28 | 3.97 | 250 | 4.5E+16 | 7.2 | Yb$_3$Al$_5$O$_{12}$ |
| Comparative Example 6 | N | 0.18 | 4.01 | 280 | 2.4E+16 | 4.4 | Yb$_3$Al$_5$O$_{12}$ |
| Comparative Example 7 | N | 0.28 | 3.97 | N | 4.5E+16 | N | Y$_3$Al$_5$O$_{12}$ |
| Comparative Example 8 | N | 40 | 2.41 | N | Cannot be measured | N | Yb$_3$Al$_5$O$_{12}$ |
| Comparative Example 10 | N | 28 | 2.93 | N | Cannot be measured | N | Yb$_3$Al$_5$O$_{12}$ |

[X1] C1 = Firing temperature maintained for 2 hours, pressure of 100 kgf/cm$^2$, in vacuum atmosphere at from room temperature to 1600° C. and subsequently in N$_2$ atmosphere at from 1600° C. to completion of firing C2 = Firing temperature maintained for 2 hours, pressure of 0 kgf/cm$^2$, in vacuum atmosphere at from room temperature to 1600° C. and subsequently in N$_2$ atmosphere at from 1600° C. to completion of firing C3 = Firing temperature maintained for 2 hours, pressure of 0 kgf/cm$^2$, in air
[X2] N = Not measured Examples 2 to 21 and Comparative Examples 1 to 10

Aluminum oxide sintered products of Examples 2 to 21 and Comparative Examples 1 to 10 were produced with the compositions and the firing conditions shown in Tables 1 and 2 in a manner similar to that in Example 1. These sintered products were measured in the same manner as in Example 1 in terms of the items (1) to (8). The measurement results are shown in Tables 1 and 2. As for atmosphere upon the firing when the firing temperature was 1700° C., vacuum atmosphere was used from room temperature to 1600° C. and nitrogen gas at 1.5 kgf/cm$^2$ was subsequently introduced while the temperature increased from 1600° C. to 1700° C. and until the firing was complete at 1700° C. In Comparative Example 10, the firing was conducted in the air and hence atmosphere controlling was not particularly conducted.

As is obvious from Table 1, the aluminum oxide sintered products of Examples 1 to 13, which were obtained by hot-press firing mixtures containing aluminum oxide serving as a main raw material and fluorine compounds ($YbF_3$, $YF_3$, and $LaF_3$) of rare-earth elements, had a volume resistivity of $1\times10^{13}$ to $1\times10^{16}$ Ω·cm at room temperature. Thus, an electrostatic chuck including such an aluminum oxide sintered product as a dielectric layer provides a higher attractive force than that of the Coulomb type electrostatic chuck and has leakage current less than that in the Johnson-Rahbeck type electrostatic chuck. Since aluminum oxide has a sufficiently high corrosion resistance and a phase containing a rare-earth element and fluorine has a higher corrosion resistance than those of silicon compounds and titanium compounds, such an aluminum oxide sintered product on the whole has a high corrosion resistance against, in particular, fluorine-based corrosive gases and the plasmas of such gases. Furthermore, it has been found that the volume resistivity at room temperature can be adjusted by changing the type or the amount of a fluorine compound of a rare-earth element added, changing firing temperature, or further adding an oxide or a nitride. In contrast, the aluminum oxide sintered products of Comparative Examples 1 to 10, which were obtained by hot-press firing mixtures containing aluminum oxide serving as a main raw material and compounds other than fluorine compounds of rare-earth elements or firing mixtures containing aluminum oxide and a fluorine compound of a rare-earth element without being pressed, had a volume resistivity of more than $1\times10^{16}$ Ω·cm at room temperature or did not have a dense body and the resistivity was not measurable. The sintered products containing the oxides of the rare-earth elements had a dense body, however, the volume resistivity was more than $1\times10^{16}$ Ω·cm at room temperature. In Example 9 where AlN was added, the volume resistivity at room temperature was considerably low of $1.7\times10^{13}$ Ω·cm but the strength was slightly reduced compared with Example 2 where MN was not added.

Figure 1B:
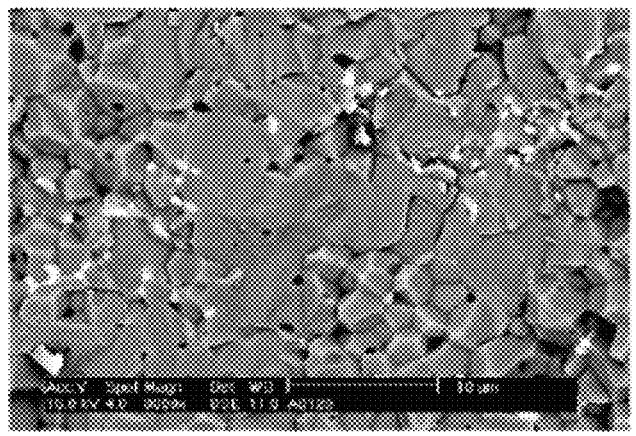
FIG. 1 shows SEM images of fracture sections of aluminum oxide sintered products.
Figure 2A:
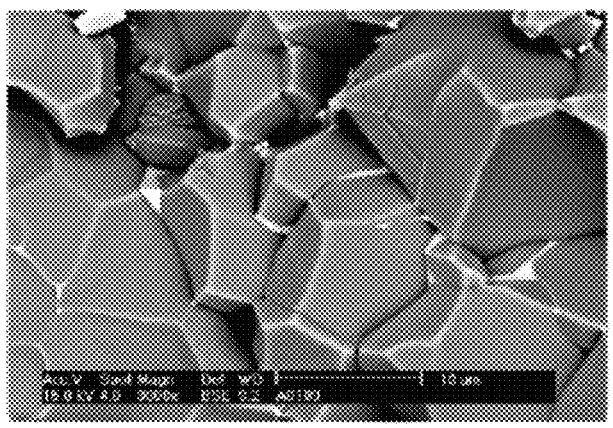
FIG. 2A corresponds to Example 3 (additive: YbF$_3$, firing temperature: 1700° C.) and FIG. 2B corresponds to Comparative Example 6 (additive: Yb$_2$O$_3$, firing temperature: 1700° C.).
Figure 2B:
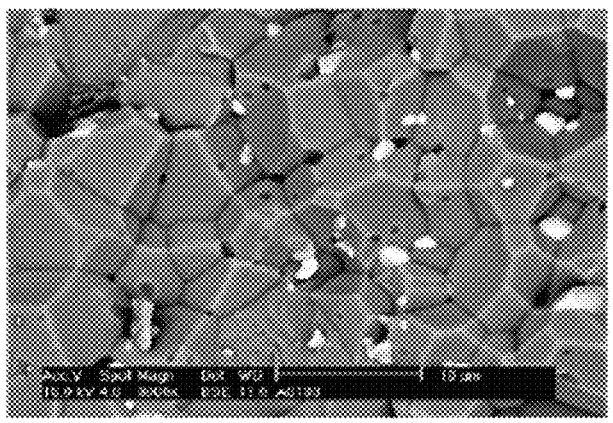
FIG. 2 shows SEM images of fracture sections of aluminum oxide sintered products.
Figure 3:
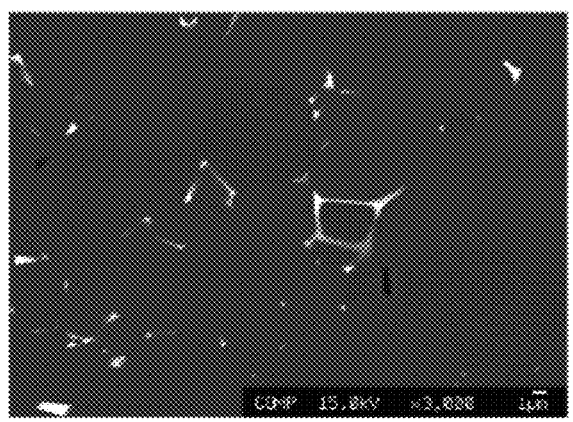
FIG. 3 is an SEM image of a mirror-polished surface in Example 7.
Figure 4:
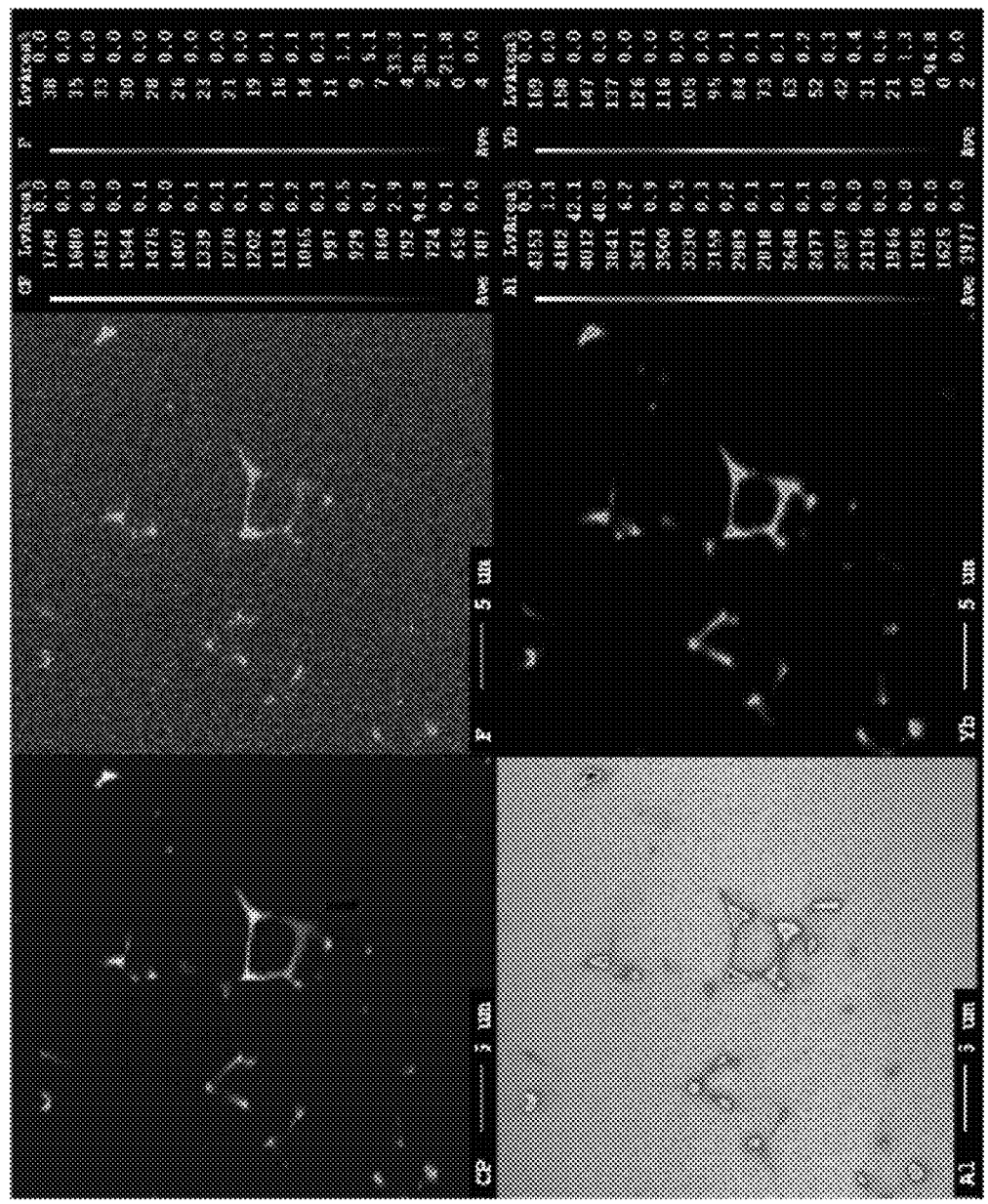
FIG. 4 shows elemental map images of F, Al, and Yb in the same field of view, the images being obtained by mapping a mirror-polished surface in Example 7 by EPMA.

FIG. 1 shows SEM images of fracture sections of aluminum oxide sintered products: Part (a) corresponds to Example 2 (additive: $YbF_3$, firing temperature: 1600° C.) and Part (b) corresponds to Comparative Example 5 (additive: $Yb_2O_3$, firing temperature: 1600° C.). FIG. 2 also shows SEM images of fracture sections of aluminum oxide sintered products: Part (a) corresponds to Example 3 (additive: $YbF_3$, firing temperature: 1700° C.) and Part (b) corresponds to Comparative Example 6 (additive: $Yb_2O_3$, firing temperature: 1700° C.). FIG. 3 is an SEM image of a mirror-polished surface in Example 7. FIG. 4 shows elemental map images of F, Al, and Yb obtained by subjecting the mirror-polished surface in Example 7 to EPMA. As is obvious from FIGS. 1 and 2, there are white layer phases among gray polyhedral aluminum oxide grains in Examples 2 and 3. This can also be seen that there are white phases along edges of the polyhedral aluminum oxide grains. FIG. 3 shows that there are also similar white phases in Example 7. It has been found out by X-ray diffraction and EPMA that such a white phase at least contains a rare-earth element and a fluorine element and mainly has the crystal phases shown in Table 1. As for the designations for the crystal phases of Examples in Table 1, $YbF_{3-x}$ refers to that peak positions for $YbF_{2.35}$, $YbF_{2.41}$, or the like were identified; and $Yb_3Al_5O_{12}$ refers to that peak positions for $Yb_3Al_5O_{12}$ were identified and this crystal phase may partially contain fluorine. Other rare-earth-aluminum oxide may also contain fluorine. In contrast, in Comparative Examples 5 and 6, there are white phase dots scattered among polyhedral aluminum oxide grains. It has been found out by X-ray diffraction and chemical analysis that such a white phase substantially contains no fluorine element. In summary, the aluminum oxide sintered products of Examples are clearly different in microstructure from the aluminum oxide sintered products of Comparative Examples.

[Relationship Between Amount of $YbF_3$ Added and Volume Resistivity at Room Temperature]

Figure 5:
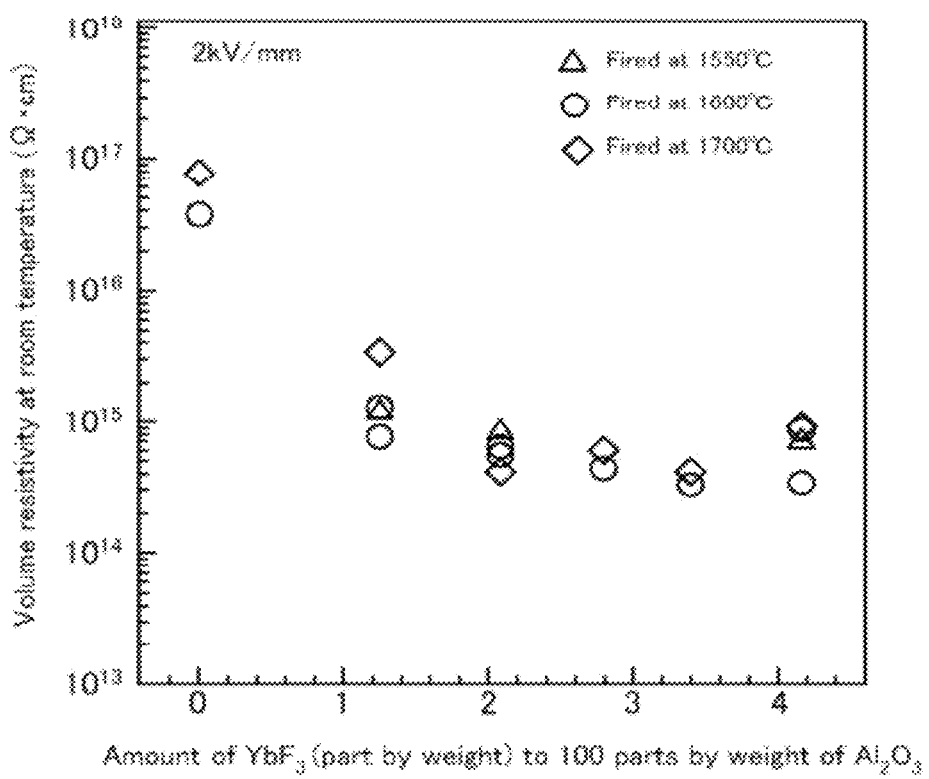
FIG. 5 is a graph showing the relationship between the amount of ytterbium fluoride added relative to 100 parts by weight of aluminum oxide and volume resistivity at room temperature.

FIG. 5 is a graph in which the amount (parts by weight) of ytterbium fluoride added relative to 100 parts by weight of aluminum oxide is plotted along the abscissa axis while the volume resistivity at room temperature (see (2) described above) is plotted along the ordinate axis. The (two) plots in which the amount of ytterbium fluoride added are zero correspond to Comparative Examples and the other plots correspond to Examples. In the graph, the reference numbers of Comparative Examples and Examples for the plots are omitted. The aluminum oxide sintered products were produced in a manner similar to that in Example 1. FIG. 5 clearly shows that aluminum oxide sintered products obtained by hot-press firing mixtures containing aluminum oxide serving as a main raw material and ytterbium fluoride in a vacuum or nitrogen gas atmosphere had a volume resistivity in the range of $1\times10^{14}$ to $1\times10^{16}$ Ω·cm at room temperature.

As is obvious from Table 1, the aluminum oxide sintered products of Examples 8 and 14 to 21, which were obtained by hot-press firing mixtures containing aluminum oxide serving as a main raw material, a fluorine compound ($YbF_3$) of the rare-earth element, and magnesium oxide, had a volume resistivity of $1\times10^{13}$ to $1\times10^{16}$ Ω·cm at room temperature as in other Examples. Thus, an electrostatic chuck including such an aluminum oxide sintered product as a dielectric layer provides a higher attractive force than that of the Coulomb type electrostatic chuck and has leakage current less than in the Johnson-Rahbeck type electrostatic chuck, which are advantageous. There are also advantages in that such an aluminum oxide sintered product on the whole has a high corrosion resistance against, in particular, fluorine-based corrosive gases and the plasmas of such gases; and the volume resistivity at room temperature can be adjusted by changing the amount of $YbF_3$ added, changing the amount of MgO added, or changing the firing temperature. In particular, the volume resistivity at room temperature was reduced to $2.2\times10^{14}$ Ω·cm (Example 8) or $4.3\times10^{13}$ Ω·cm (Example 17) in the case of adding MgO and $YbF_3$, whereas the volume resistivity at room temperature was reduced at best to about $3\times10^{14}$ Ω·cm (Examples 6 and 7) in the case of adding only $YbF_3$ as an additive in Examples 1 to 7.

Figure 6:
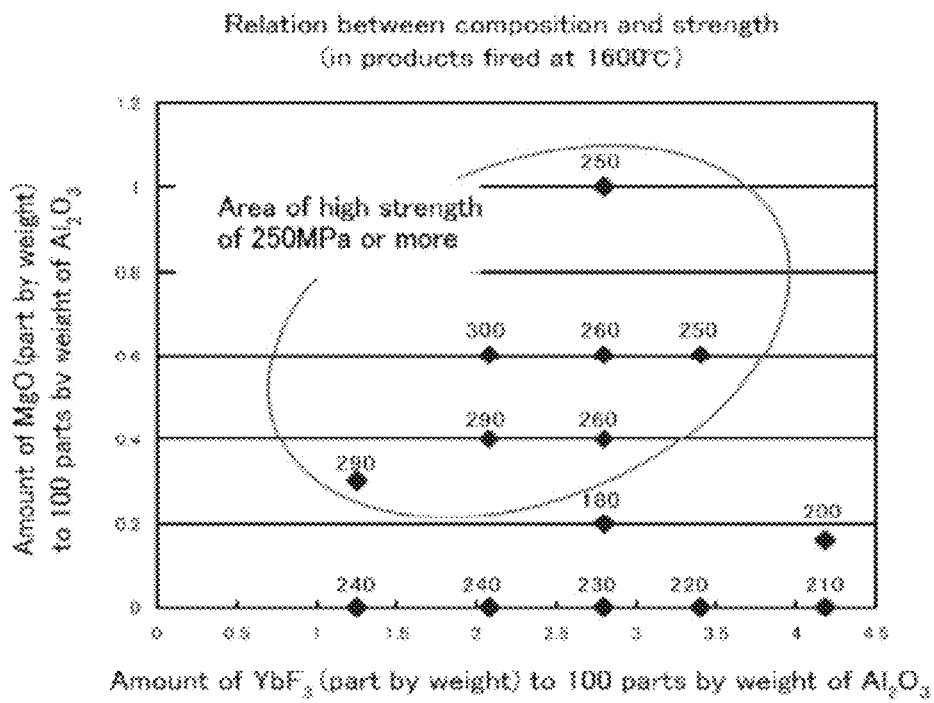
FIG. 6 is a graph in which each plot is shown with corresponding strength, the abscissa axis indicates parts by weight of YbF$_3$, and the ordinate axis indicates parts by weight of MgO.
Figure 7:
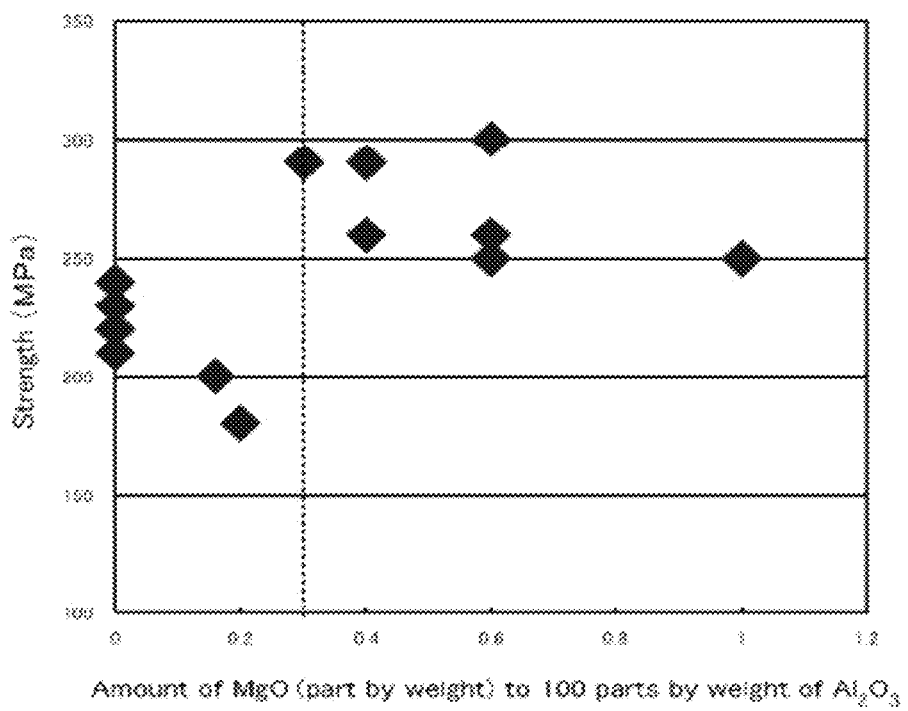
FIG. 7 is a graph in which the abscissa axis indicates parts by weight of MgO, and the ordinate axis indicates strength.

FIGS. 6 to 9 are graphs that have summarized the data of Examples 1, 2, 4, 6 to 8, and 14 to 21. FIG. 6 is a graph in which each plot is shown with corresponding strength, the abscissa axis indicates parts by weight of $YbF_3$, and the ordinate axis indicates parts by weight of MgO. FIG. 7 is a graph in which the abscissa axis indicates parts by weight of MgO, and the ordinate axis indicates strength. The "parts by weight" of each axis is an amount of each component added relative to 100 parts by weight of $Al_2O_3$. These graphs show that addition of 0.3 or more parts by weight of MgO relative to 100 parts by weight of $Al_2O_3$ results in a strength of 250 MPa or more, which is a higher strength than that in the case where no MgO is added.

Figure 8:
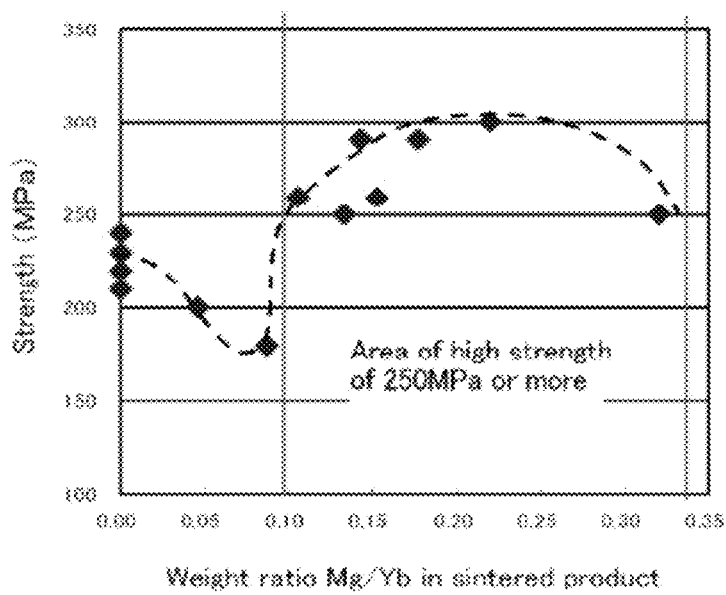
FIG. 8 is a graph in which the abscissa axis indicates a weight ratio Mg/Yb and the ordinate axis indicates strength.

FIG. 8 is a graph in which the abscissa axis indicates a weight ratio Mg/Yb in a sintered product and the ordinate axis indicates strength. This graph shows that a Mg/Yb of 0.10 to 0.33 results in a strength of 250 MPa or more, which is a higher strength than that in the case where no MgO is added. A weight ratio Mg/Yb of 0.1 to 0.33 is converted into a weight ratio $MgO/YbF_3$ of 0.12 to 0.41.

Figure 9:
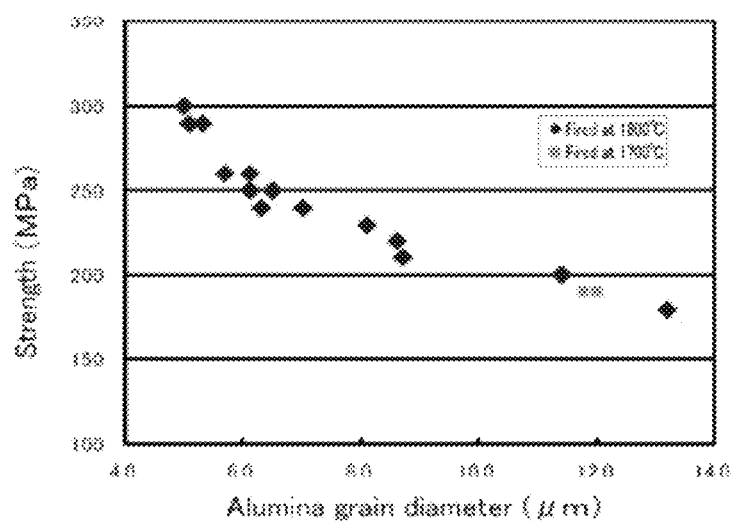
FIG. 9 is a graph in which the abscissa axis indicates the alumina grain diameter of a sintered product and the ordinate axis indicates strength.

FIG. 9 is a graph in which the abscissa axis indicates the alumina grain diameter of a sintered product and the ordinate axis indicates the strength of the sintered product. This graph shows that an alumina grain diameter of 7 μm or less, in particular, 6 μm or less results in a sintered product having a high strength.

Figure 10C:
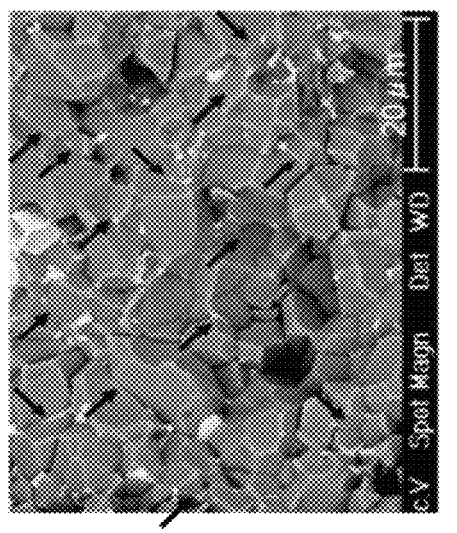
FIG. 10 shows SEM images of fracture sections of aluminum oxide sintered products.
FIG. 10A corresponds to Example 4, FIG. 10B corresponds to Example 16, and FIG. 10C corresponds to Example 17.
Figure 10B:
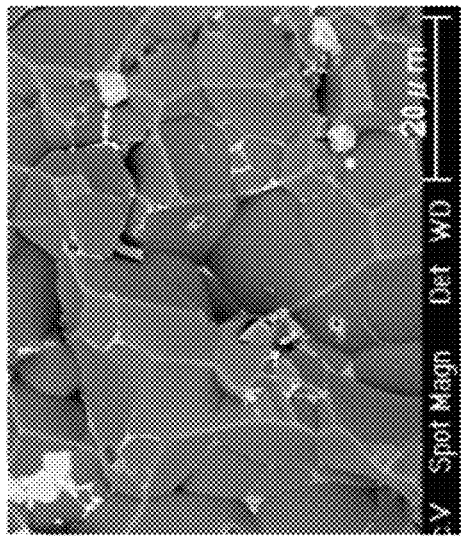
Figure 10A:
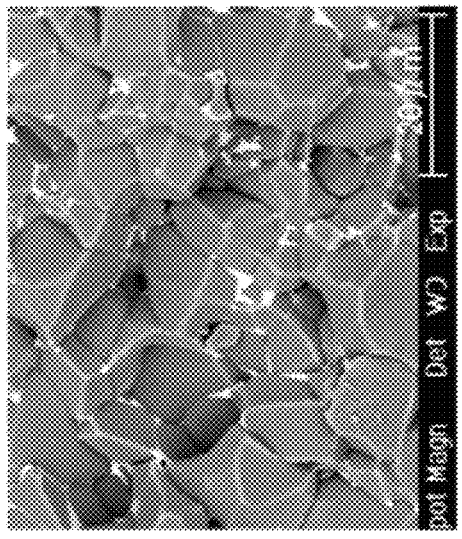
Figure 11:
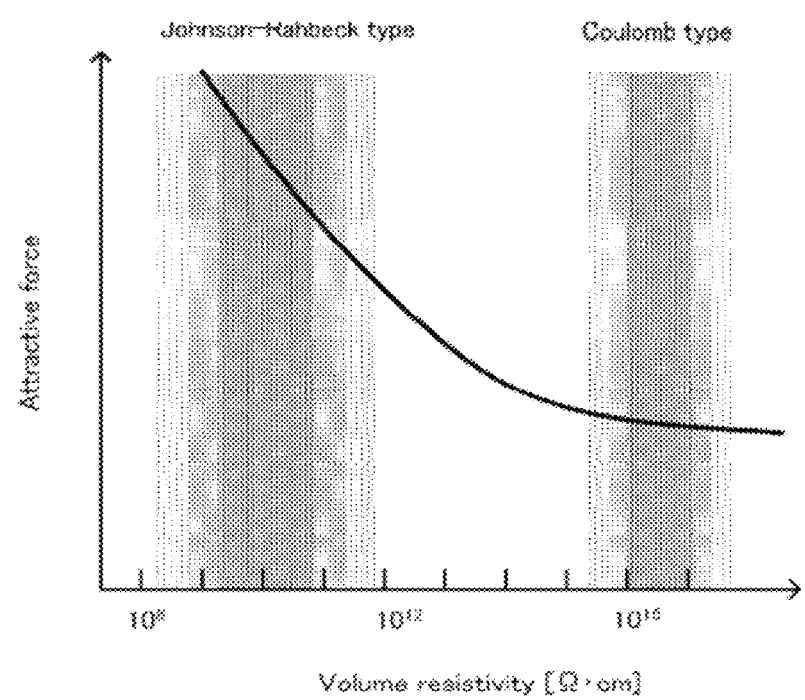
FIG. 11 is a graph showing the relationship between volume resistivity and attractive force.

FIG. 10 shows SEM images of fracture sections of aluminum oxide sintered products: Part (a) corresponds to Example 4, Part (b) corresponds to Example 16, and Part (c) corresponds to Example 17. As is obvious from these SEM images, there are continuous white phase portions among gray polyhedral aluminum oxide grains in the SEM images of Examples 4, 16, and 17. Specifically, the white phases are partially present as layers and partially present along edges of polyhedral aluminum oxide grains (Since it is difficult to recognize the white phases present along edges of polyhedral grains in FIG. 10(c) showing the SEM image of Example 17, the white phases are pointed with arrows). The white phases mainly have the crystal phases shown in Table 1. The white phases in Example 17 contained $MgF_2$ due to addition of MgO. This $MgF_2$ was presumably generated as a result of reaction between MgO and $YbF_3$. The peak of $MgF_2$ was not detected in Example 16 due to the small amount of MgO added; however, $MgF_2$ was presumably actually present. As is obvious from FIG. 10, compared with Example 4 in which the amount of MgO added was zero, Example 16 in which 0.2 parts by weight of MgO was added resulted in the large alumina grain diameter and the reduced strength, whereas Example 17 in which 0.4 parts by weight of MgO was added resulted in the small alumina grain diameter and the increased strength compared with the case where no MgO was added. In summary, it has been found that addition of a predetermined amount of MgO suppresses an increase in the size of alumina sintered grains and increases the strength while addition of a smaller amount of MgO promotes growth of the grains. The reason for this is not known; however, the following is presumably the reason. Crystal phase analysis of a sintered product shows that addition of MgO results in generation of $MgF_2$. It is known that the liquid phase of $MgF_2$ is generated at 967° C. in a phase diagram of $MgF_2$ and $YbF_3$ ($MgF_2$—$YbF_3$). Example 16 in which 0.2 parts by weight of MgO were added corresponded to a composition level close to the composition at the eutectic temperature (967° C.). Thus, in Example 16, the temperature at which the liquid phase is generated was decreased and the amount of the liquid phase generated was increased during a temperature rise in the firing, to thereby presumably promoting grain growth. In contrast, in Example 17 in which 0.4 parts by weight of MgO was added, the temperature that crosses the liquid phase line of the phase diagram of a composition level of $MgF_2$ can exceed the melting point of $YbF_3$. There is a possibility that this reduced the amount of the liquid phase during the firing compared with Example 4 where no MgO was added, and grain growth was suppressed. The volume resistivity at room temperature was higher in Example 18 in which 0.6 parts by weight of MgO were added and Example 19 in which 1.0 part by weight of MgO was added than that in Example 17. This is presumably because the amount of $YbF_3$ that reacted with MgO was larger in Examples 18 and 19 and hence the amount of $YbF_3$ contained in the white phases decreased and a decrease in the resistivity was suppressed.

The present application claims priorities from Japanese Patent Application No. 2008-223910 filed on Sep. 1, 2008, and Japanese Patent Application No. 2009-174334 filed on Jul. 27, 2009, the entire contents of both of which are incorporated herein by reference.

What is claimed is:

1. An aluminum oxide sintered product comprising:
a layer phase containing a rare-earth element and fluorine among aluminum oxide grains as a main component;
wherein the aluminum oxide sintered product comprises an electrostatic chuck.

2. An aluminum oxide sintered product comprising:
a phase containing a rare-earth element and fluorine along edges of aluminum oxide grains as a main component;
wherein the aluminum oxide sintered product comprises an electrostatic chuck.

3. The aluminum oxide sintered product according to claim 1,
wherein the aluminum oxide sintered product has a volume resistivity of $1 \times 10^{13}$ to $1 \times 10^{16}$ Ω·cm, the volume resistivity being calculated from a current value after a lapse of 1 minute from an application of a voltage of 2 kV/mm to the aluminum oxide sintered product at room temperature.

4. The aluminum oxide sintered product according to claim 2,
wherein the aluminum oxide sintered product has a volume resistivity of $1 \times 10^{13}$ to $1 \times 10^{16}$ Ω·cm, the volume resistivity being calculated from a current value after a lapse of 1 minute from an application of a voltage of 2 kV/mm to the aluminum oxide sintered product at room temperature.

5. The aluminum oxide sintered product according to claim 3, wherein the rare-earth element is at least one element selected from the group consisting of yttrium, lanthanum, and ytterbium.

6. The aluminum oxide sintered product according to claim 4, wherein the rare-earth element is at least one element selected from the group consisting of yttrium, lanthanum, and ytterbium.

7. The aluminum oxide sintered product according claim 5, wherein a content of the rare-earth element relative to the sintered product in its entirety is 0.1 to 20 wt %, and wherein a content of the fluorine relative to the sintered product in its entirety is 0.05 to 5 wt %.

8. The aluminum oxide sintered product according claim 6, wherein a content of the rare-earth element relative to the sintered product in its entirety is 0.1 to 20 wt %, and wherein a content of the fluorine relative to the sintered product in its entirety is 0.05 to 5 wt %.

9. The aluminum oxide sintered product according to claim 7, wherein the phase containing the rare-earth element and fluorine further contains magnesium, and wherein a content of the magnesium relative to the sintered product in its entirety is 0.1 wt % or more.

10. The aluminum oxide sintered product according to claim 8, wherein the phase containing the rare-earth element and fluorine further contains magnesium, and wherein a content of the magnesium relative to the sintered product in its entirety is 0.1 wt % or more.

11. The aluminum oxide sintered product according to claim 1, wherein the aluminum oxide grains have a diameter of 7 μm or less.

12. The aluminum oxide sintered product according to claim 2, wherein the aluminum oxide grains have a diameter of 7 μm or less.

13. A method for producing an aluminum oxide sintered product, comprising:
   hot-press firing a mixture containing aluminum oxide as a main raw material and a fluorine compound of a rare-earth element in a vacuum or an inert atmosphere to provide the aluminum oxide sintered product
   wherein said hot-press firing step is performed under vacuum conditions from room temperature to a predetermined temperature, and thereafter, an inert atmosphere is introduced from the predetermined temperature to a maximum firing temperature.

14. The method for producing an aluminum oxide sintered product according to claim 13, wherein 0.5 to 10 parts by weight of the fluorine compound of the rare-earth element are added relative to 100 parts by weight of the aluminum oxide.

15. The method for producing an aluminum oxide sintered product according to claim 14, wherein the mixture contains 0.3 or more parts by weight of magnesium oxide relative to 100 parts by weight of the aluminum oxide.

16. The method for producing an aluminum oxide sintered product according to claim 13, wherein said predetermined temperature is in a range of 1500° C. to 1600° C.

17. The method for producing an aluminum oxide sintered product according to claim 13, wherein said maximum firing temperature is in a range of 1500° C. to 1750° C.

18. An aluminum oxide sintered product comprising:
   a layer phase containing a rare-earth element and fluorine among aluminum oxide grains as a main component;
   wherein the aluminum oxide sintered product has a volume resistivity of $1\times10^{13}$ to $1\times10^{16}$ Ω·cm, the volume resistivity being calculated from a current value after a lapse of 1 minute from an application of a voltage of 2 kV/mm to the aluminum oxide sintered product at room temperature;
   wherein the rare-earth element is at least one element selected from the group consisting of yttrium, lanthanum, and ytterbium;
   wherein a content of the rare-earth element relative to the sintered product in its entirety is 0.1 to 20 wt %, and wherein a content of the fluorine relative to the sintered product in its entirety is 0.05 to 5 wt %;
   wherein the layer phase containing the rare-earth element and fluorine further contains magnesium, and wherein a content of the magnesium relative to the sintered product in its entirety is 0.1 wt % or more, and wherein a weight ratio of a content of the magnesium in the sintered product to a content of the rare-earth element in the sintered product is 0.1 to 0.33.

19. An aluminum oxide sintered product comprising:
   a phase containing a rare-earth element and fluorine along edges of aluminum oxide grains serving as a main component;
   wherein the aluminum oxide sintered product has a volume resistivity of $1\times10^{13}$ to $1\times10^{16}$ Ω·cm, the volume resistivity being calculated from a current value after a lapse of 1 minute from an application of a voltage of 2 kV/mm to the aluminum oxide sintered product at room temperature;
   wherein the rare-earth element is at least one element selected from the group consisting of yttrium, lanthanum, and ytterbium;
   wherein a content of the rare-earth element relative to the sintered product in its entirety is 0.1 to 20 wt %, and wherein a content of the fluorine relative to the sintered product in its entirety is 0.05 to 5 wt %;
   wherein the phase containing the rare-earth element and fluorine further contains magnesium, and wherein a content of the magnesium relative to the sintered product in its entirety is 0.1 wt % or more, and wherein a weight ratio of a content of the magnesium in the sintered product to a content of the rare-earth element in the sintered product is 0.1 to 0.33.

20. A method for producing an aluminum oxide sintered product, comprising:
   hot-press firing a mixture containing aluminum oxide, as a main raw material, and a fluorine compound of a rare-earth element in a vacuum or an inert atmosphere to provide the aluminum oxide sintered product;
   wherein 0.5 to 10 parts by weight of the fluorine compound of the rare-earth element are added relative to 100 parts by weight of the aluminum oxide;
   wherein the mixture contains 0.3 or more parts by weight of magnesium oxide relative to 100 parts by weight of the aluminum oxide; and
   wherein a weight ratio of the magnesium oxide to the fluorine compound of the rare-earth element is 0.1 to 0.4.

* * * * *